United States Patent [19]
Wang

[11] Patent Number: 6,028,012
[45] Date of Patent: Feb. 22, 2000

[54] PROCESS FOR FORMING A GATE-QUALITY INSULATING LAYER ON A SILICON CARBIDE SUBSTRATE

[75] Inventor: Xiewen Wang, Orange, Conn.

[73] Assignee: Yale University, New Haven, Conn.

[21] Appl. No.: 08/760,056

[22] Filed: Dec. 4, 1996

[51] Int. Cl.$^7$ ................................................... H01L 29/78
[52] U.S. Cl. ......................................... 438/779; 438/778
[58] Field of Search .................................... 438/773, 778, 438/779, 787, 788

[56] References Cited

U.S. PATENT DOCUMENTS

| | | |
|---|---|---|
| 4,788,082 | 11/1988 | Schmitt . |
| 5,562,952 | 10/1996 | Nakahigashi et al. . |
| 5,597,744 | 1/1997 | Kamiyama et al. . |
| 5,614,749 | 3/1997 | Ueno . |
| 5,656,516 | 8/1997 | Suzuki . |
| 5,789,311 | 8/1998 | Ueno et al. . |
| 5,796,122 | 8/1998 | Weitzel et al. . |

OTHER PUBLICATIONS

A. Golz, R. Janssen, E. Stein von Kamienski, and H. Kurz, "Characterization of oxides on Silicon Carbide Deposited by Remote Plasma Enhanced Chemical Vapor Deposition", The Physics and Chemistry of the Si–SiO2 Interface 3, Proc. vol. 96–1, pp. 753–758, 1996.

John L. Vossen, Werner Kern, thin film Processes II, pp. 317–321, 1991.

John L. Vossen and Werner Kern, Thin Film Processing II, Academic Press, 1991, 317–319, 1991.

Wang, et al., "Highly Reliable Silicon Nitride Thin Films Made by Jet Vapor Deposition," J.Appl. Phys. vol. 34 (Feb. 1995) pp. 956–959.

Gölz, et al., Characterization of Oxides on Silicon Caride Deposited by Remote Plasma Enhanced Chemical Vapor Deposition, *The Physics of Chemistry of SiO$_2$ and the Si–SiO$_2$ Interface—3*, vol. 96–1, pp. 753–758 (1996).

Kwangok, et al., "Controlled Nitrogen Incorporation at SiO$_2$ Interfaces by Remote Plasma–Assisted Processing," Enc. & Appl. Sci., (1996) pp. 344–346.

Zetterling, et al., "The Influence of Dry Cleaning Techniques on Thermal Oxides Grown on 4H and 6H P–Type SiC," Poster presented at ICSCRM 1995.

*Primary Examiner*—Charles Bowers
*Assistant Examiner*—Martin Sulsky
*Attorney, Agent, or Firm*—Fish & Richardson P.C.

[57] ABSTRACT

A method of fabricating a semiconductor structure involving the steps of providing a SiC substrate, treating the SiC substrate with an N$_2$O-containing plasma, and forming a dielectric layer on the surface of the pretreated SiC substrate. A semiconductor structure produced by the method above. An apparatus for forming a dielectric layer on a SiC substrate including a deposition chamber in which the SiC substrate is placed, a first valve that connects a first source providing N$_2$O to the deposition chamber, a second valve that connects a second source providing reactants that form the dielectric layer to the deposition chamber, an energy source for producing an N$_2$O-containing plasma from N$_2$O released from the first source by the first valve, and a controller that programs providing power to the energy source and opening and closing the first and second valves into two phases. A first phase in which power is provided to the energy source, the first valve is kept open, and the second valve is kept closed so that the SiC substrate can be pretreated with N$_2$O-containing plasma. The first phase is followed by a second phase in which the second valve is kept open so that the dielectric layer can be formed.

15 Claims, 3 Drawing Sheets

PROCESS FOR FORMING A GATE-QUALITY INSULATING LAYER ON A SILICON CARBIDE SUBSTRATE

BACKGROUND OF THE INVENTION

This invention generally relates to a process for improving the quality of semiconductor devices which employ a dielectric layer deposited on a silicon carbide substrate.

Metal-oxide-semiconductor (MOS) structures and more generally metal-insulator-semiconductor (MIS) structures are used in numerous semiconductor devices such as CMOS, MOSFET, MISFET, JFET, IGBT, and MCT. MIS devices in which silicon carbide (SiC) is the substrate are attractive for high power, high frequency, and high temperature applications. Typically a thermal oxide is thermally grown on a SiC substrate by oxidizing SiC at temperatures between 1050° C. and 1300° C. in a wet $O_2$ furnace. The quality of the oxide layer generally improves with decreasing temperature but the time required to form the oxide layer is longer. For example, formation of a 50-nm thick oxide layer by thermal oxidation at 1050° C. takes approximately 25 hours. Even at the lowest temperatures (1050° C.), thermal oxide layers formed on p-type SiC substrates have historically yielded poor quality devices, with the best devices having oxide charge and interface trap densities on the order of $1\times10^{12}$ cm$^{-2}$ and $1-2\times10^{11}$ cm$^{-2}$/eV respectively. Other deposition methods based on chemical vapor deposition (CVD) have also been tried, but have not specifically reduced the oxide charge density that are achievable by the thermal oxidation.

To approach acceptable MOS device levels, the oxide charge density in p-type MOS SiC based devices must be reduced, preferably with shorter oxide formation times.

SUMMARY OF THE INVENTION

In general, in one aspect, the invention is a method of fabricating a semiconductor structure including the steps of providing a Sic substrate, treating the SiC substrate with a plasma generated in an atmosphere containing $N_2O$ and He, and forming a dielectric layer on the surface of the pretreated SiC substrate.

Preferred embodiments have any of the following features. The SiC substrate is p-type. The SiC substrate is not heated during the plasma treatment step. The plasma is carried to the SiC substrate in a jet during the plasma treatment step. The plasma is generated in an atmosphere containing $N_2O$ and He. The step of forming the dielectric layer includes producing a second plasma. The step of forming the dielectric layer comprises jet vapor deposition. The step of forming the dielectric layer comprises chemical vapor deposition. The method further includes the steps of annealing the dielectric layer formed on the SiC substrate and forming a gate electrode on the annealed dielectric layer. The dielectric layer is $SiO_2$. The $SiO_2$ dielectric layer is formed by reacting species derived from $N_2O$ and $SiH_4$. The reactive species of $N_2O$ and $SiH_4$ are produced using a plasma.

In general, in another aspect, the invention is a semiconductor structure fabricated by the method described above.

In general, in yet another aspect, the invention is an apparatus for forming a dielectric layer on a SiC substrate including a deposition chamber in which the SiC substrate is placed, a first valve that connects a first source providing $N_2O$ to the deposition chamber, a second valve that connects a second source providing reactants that form the dielectric layer to the deposition chamber and an energy source for producing an $N_2O$ plasma from $N_2O$ released from the first source by the first valve. The apparatus also includes a controller that programs providing power to the energy source and opening and closing the first and second valves into two phases, a first phase in which power is provided to the energy source, the first valve is kept open, and the second valve is kept closed so that the SiC substrate can be pretreated with $N_2O$ plasma, followed by a second phase in which the second valve is kept open so that the dielectric layer can be formed.

An advantage of the invention is that it produces SiC based MIS structure having much lower oxide charge densities than the oxide charge density of the highest quality SiC based MIS structures produced by other methods in the art. Another advantage of the invention is that it produces SiC based MIS structures having interface trap densities that are as low as the interface trap densities of the highest quality SiC based MIS structures produced by other methods in the art. A further advantage of the invention is that the structures are produced with dielectric layer formation times that are short relative to the formation times of similar structures having comparable oxide charge and interface trap densities produced by the thermal oxidation method.

Other features and advantages of the invention will be apparent the following description of the preferred embodiment and from the claims.

DESCRIPTION OF THE PREFERRED EMBODIMENT

We have discovered that pretreating a silicon carbide (SiC) substrate with a plasma containing a mixture of nitrous oxide ($N_2O$) and helium (He) substantially improves the properties of a metal-insulator-semiconductor (MIS) capacitor made from the SiC substrate. We fabricated SiC metal-oxide-semiconductor (MOS) capacitors by first pretreating p-type SiC substrates with a plasma generated in an atmosphere containing nitrous oxide ($N_2O$) and helium (He). Then, we formed an oxide ($Sio_2$) layer on the substrates by mixing the $N_2O$/He plasma with a plasma generated in an atmosphere containing a small amount of silane ($SiH_4$) diluted in He and exposing the substrates to the mixture. Thereafter, we formed aluminum gate electrodes for the capacitors using standard techniques. The p-type SiC capacitors had oxide charge densities that were typically less than $3\times10^{11}$ cm$^{-2}$ and interface trap densities of approximately $1-2\times10^{11}$ cm$^{-2}$/eV. These results were completely reproducible for subsequent fabrication runs.

Figure 1:
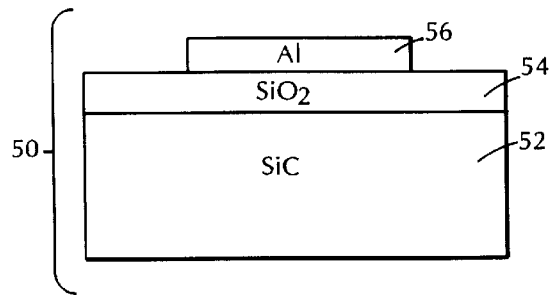
FIG. 1 shows a cross-section of a typical SiC MOS capacitor fabricated in accordance with the invention.

FIG. 1 shows a cross-section of a typical SiC MOS capacitor 50 fabricated according to the invention. Capacitor 50 includes a SiC substrate 52, a SiO$_2$ oxide layer 54 formed above the SiC surface, and an aluminum gate electrode 56 formed above the oxide layer.

The oxide layer can be formed using jet vapor deposition (JVD), which is well known in the art (see for example, Schmitt in U.S. Pat. No. 4,788,082). In JVD, a supersonic jet of a light carrier gas, such as helium (He), transports deposition vapor from a source to a substrate. A nozzle contained within a flow system pumped by a high-speed mechanical pump forms the jet at the opening of the nozzle. When the pressure inside the nozzle is much larger than the pressure outside the nozzle, the flow beyond the exit of the nozzle will rapidly expand, making it possible to rapidly propel condensable vapor toward the surface of a substrate.

Figure 2:
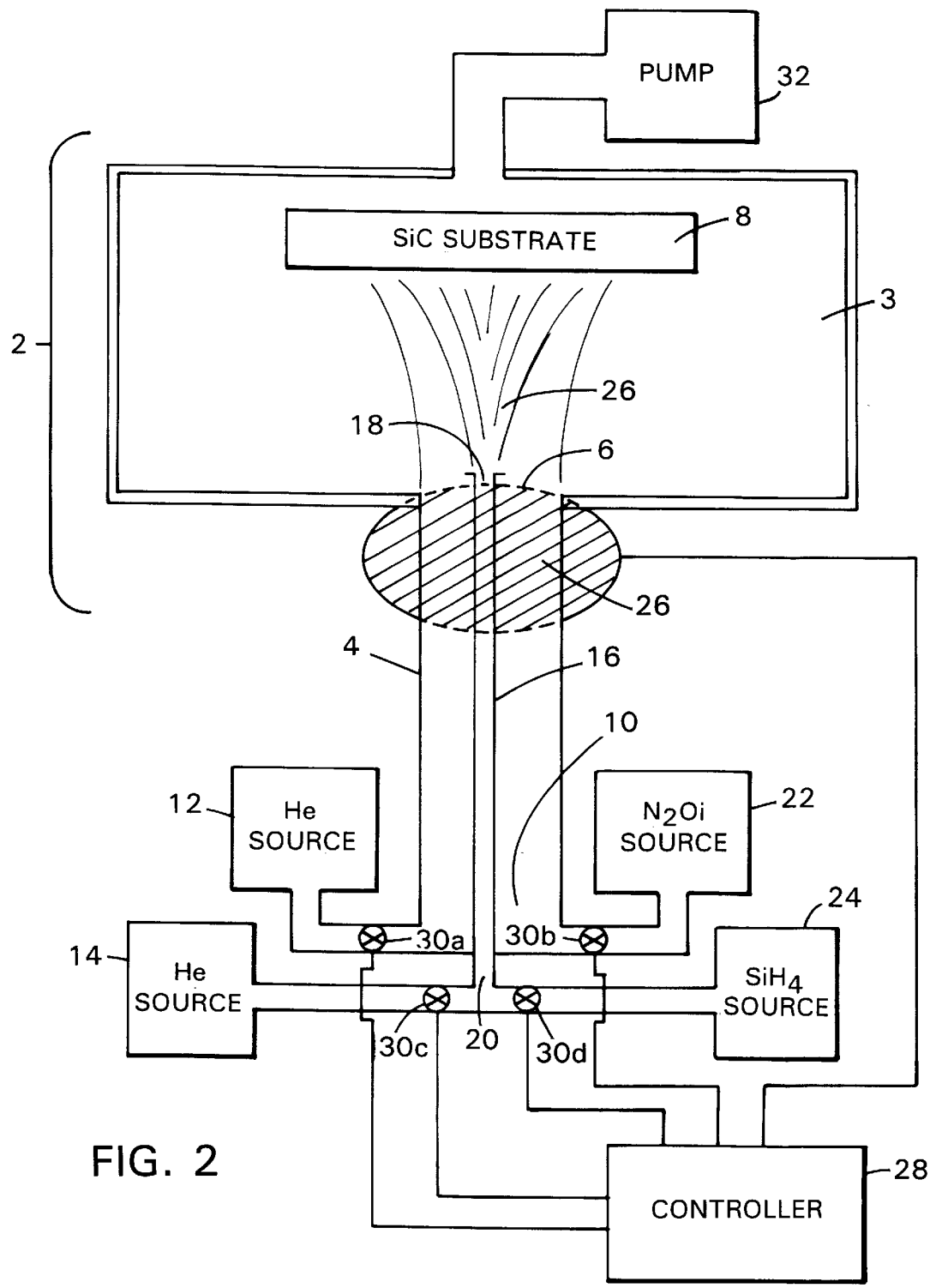
FIG. 2 shows a schematic diagram of an apparatus for fabricating SiC MOS structures in accordance with the invention.

FIG. 2 shows a modified JVD apparatus 2 for fabricating SiC structure 50 according to the invention. Apparatus 2 includes a deposition chamber 3 in which a cleaned SiC substrate 8 is placed. The apparatus further includes a one-inch diameter quartz outer tube 4 (outer nozzle) having an open end 6 facing the SiC substrate 8 and an opposite end 10 that connects to a He source 12 and N$_2$O source 14. Enclosed within outer tube 4 is a co-axial 1-mm diameter quartz inner tube 16 (inner nozzle) having an open end 18 facing substrate 8 and an opposite end 20 that connects to a second He source 14 and a SiH$_4$ source 24. The inner tube 16 carries only a small fraction of silane relative to helium. As the gases flow from the sources through the tubes, they pass through an microwave discharge 26 near the open ends of the tubes. The microwave discharge (typically 80 W) ionizes the gases forming plasmas in both tubes. At the tube openings, inner tube 16 forms a jet 26 that carries the ionized reactive gases toward substrate 8. The apparatus 2 also includes a controller 28, which controls the power to microwave discharge 26 and the opening and closing of valves 30a–30d for respective gas sources 12, 14, 22, 24. Deposition chamber 3 is connected to a high-speed mechanical pump 32 which keeps the pressure in the deposition chamber relatively low.

Figure 3:
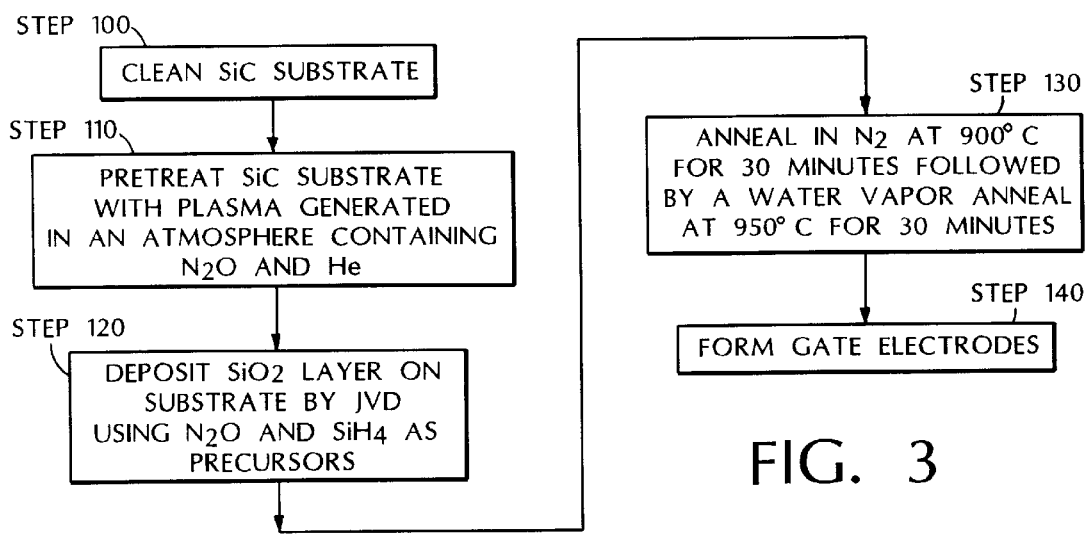
FIG. 3 shows a sequence of steps for fabricating SiC MOS structures in accordance with the invention.

FIG. 3 shows a sequence of steps for fabricating SiC MOS structure 50 shown in FIG. 1. The surface of a SiC substrate is first cleaned by the following standard procedure (step 100). The substrate is placed in a bath of three parts sulfuric acid and one part hydrogen peroxide for approximately five minutes. It is then rinsed with deionized water. Hydrofluoric acid is then used to remove native oxide from the substrate surface. Thereafter, the substrate is rinsed with deionized water, dried with N$_2$, and placed directly into deposition chamber 3 of apparatus 2 for the pretreatment step.

In the pretreatment step, controller 28 turns on the power to microwave discharge 26 and opens valves 30a–30c for N$_2$O source 22 and He sources 12 and 14 (valve 30d for the SiH$_4$ source is kept closed) so that the jet carries the ionized N$_2$O and He, but no Si species, to the SiC substrate (step 110).

After the pretreatment step, controller 28 opens valve 30d for SiH$_4$ source 24 so that the jet carries reactive Si species in addition to ionized N$_2$O and He toward the substrate where species derived from the SiH$_4$ and N$_2$O react with one another to form an oxide (SiO$_2$) layer at the substrate surface (step 120).

Following oxide deposition, the oxide layer is furnace annealed in a nitrogen (N$_2$) ambient at 900° C. for 30 minutes followed by a water vapor anneal in a standard steam oxidation furnace at 950° C. for 30 minutes (step 130). No appreciable thermal oxidation occurs in SiC at these temperature. After the annealing step, standard photolithography and metalization techniques are used to form gate electrodes (step 140).

In our experiments, we fabricated SiC MOS structures using the method (shown in FIG. 3) and apparatus 2 (shown in FIG. 2) described above, except that we controlled the power to the microwave discharge 26 and the opening and closing of valves 30a–30d manually rather than using a controller 28.

The specific conditions for our experiments are described below. We used p-type 6H-SiC substrates obtained from Cree Research Inc. (Durham, N.C. 27713). The p-type SiC substrates are doped with boron and have a boron concentration of 3×10$^6$ cm$^{-3}$ in a 3-micron epitaxial layer and 2×10$^{18}$ cm$^{-3}$ in the bulk. Flow rates from tubes 4 and 16 into deposition chamber 3 were measured in standard cubic centimeters per minute (sccm). When all gate valves 30a–30d in apparatus 2 were opened, the flow rate from the inner tube was 6 sccm SiH$_4$ /256 sccm He and the flow rate from the outer tube was 333 sccm N$_2$O/1860 sccm He. The pressure in the deposition chamber was approximately 1.5 torr. In the pretreatment step (step 110), the substrate was exposed to the plasma generated in the outer tube (having an atmosphere containing N$_2$O and He) for 30 minutes at room temperature. In the deposition step (step 120), the substrate was exposed to the mixture of the plasma generated in the outer tube and the plasma generated in the inner tube (having an atmosphere containing a small amount of SiH$_4$ in He) for 40 minutes at room temperature producing an oxide layer having a thickness of approximately 72 nm. These conditions are only illustrative and similar results can be obtained under a variety of process conditions.

Figure 4:
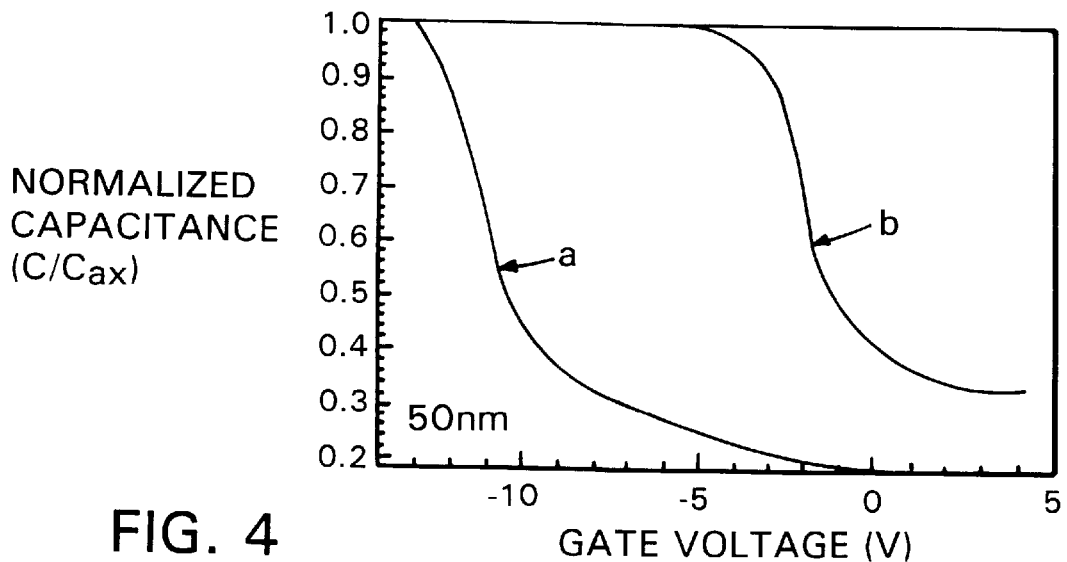
FIG. 4 shows C-V curves for two ("a" and "b") SiC MOS capacitors fabricated according to the method shown in FIG. 3 except that the capacitor characterized by curve "a" was fabricated without pretreating the SiC substrate with $N_2O$/He plasma. The oxide layer for both capacitors was 50 nm.
Figure 5:
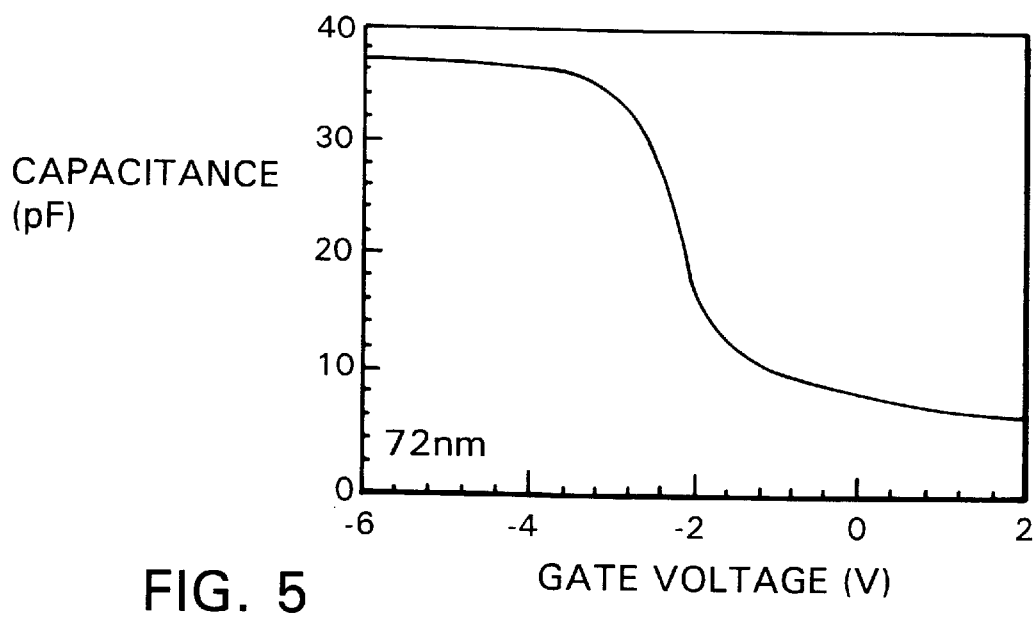
FIG. 5 shows a C-V curve for a 72-nm thick SiC MOS capacitor fabricated according to the method shown in FIG. 3.

We characterized the SiC MOS capacitors produced by the method above by measuring capacitance as a function of gate voltage at 10 kHz, as shown in FIGS. 4 and 5. The capacitance goes from a large maximum value at negative gate voltage (for a p-type substrate) to a minimum value at a positive gate voltage. The sharp decrease in the value of the capacitance occurs near the flat-band voltage (as shown in FIG. 5). The precise definition of the flat-band voltage is the gate voltage at which the energy bands of the substrate (SiC) are flat, i.e do not bend, in the vicinity of the insulator interface. In the absence of oxide charge, the flat band voltage is equal to the work function difference between the materials on the opposite sides of the insulator (SiO$_2$). To determine oxide charge density N, the following formula is used:

$$N = (\Delta V_{fb} \times C_{ox})/(e \times A) \quad (1)$$

where $\Delta V_{fb}$ is the difference between the ideal flat-band voltage (in the absence of oxide charge) and the measured flat-band voltage, $C_{ox}$ is the maximum capacitance, A is the area of the capacitor, and e is the charge on an electron. For the case of Al and p-type 6H SiC the work function difference is approximately −2.8 V at room temperature. The measured flat-band voltage for a real SiC MOS capacitor will be more negative than −2.8 V and will approach this ideal value from more negative voltages as oxide charge is minimized for a particular fabrication process. A very negative flat-band voltage indicates an SiC capacitor with a large density of oxide charge and a device using such a SiC capacitor will not be reliable.

FIG. 4 shows C-V curves ("a" and "b") for two 50-nm thick SiC capacitors. We fabricated both capacitors by the method described above except that for one capacitor (characterized by the curve labelled "a") the N₂O plasma pretreatment step was omitted. Qualitatively, the flat-band voltage for the capacitor produced without the N₂O-containing plasma pretreatment is at least 13 V, whereas the flat-band voltage for the capacitor produced with the N₂O plasma pretreatment is about 3.3 V. These results show that the N₂O-containing plasma pretreatment is a critical factor in reducing oxide charge.

FIG. 5 shows a C-V curve for a typical 72-nm thick p-type SiC capacitor that we produced using the method described above. In this case, the flat band voltage is approximately 3.1 V, which is very close to the ideal value. Typical values of oxide charge densities determined from the C-V data for the 72-nm SiC capacitors varied between $2.5 \times 10^{11}$ cm$^{-2}$ and $4.5 \times 10^{11}$ cm$^{-2}$. In the prior art, the best reported value for oxide charge density in a p-type SiC MOS capacitor was $9 \times 10^{11}$ cm$^{-2}$, and more typical values were greater than $1 \times 10^{12}$ cm$^{-2}$. Accordingly, the method described above significantly minimizes the oxide charge density in a p-type SiC MOS capacitor and will improve the quality of devices formed from the SiC MOS capacitor.

As with large oxide charge densities, large interface trap density in MIS capacitors also produce unreliable results in devices using the MIS capacitors. Qualitatively, a large interface trap density will distort and stretch the C-V curve in the transition region. Both FIGS. 4 and 5 show C-V curves that are relatively smooth in the transition region. The interface trap density can be determined from C-V data but measuring AC conductance yields more accurate values. For the test SiC capacitors that we produced using the method above, AC conductance measurements yielded values for interface trap densities ($D_{it}$) in the range of $1-2 \times 10^{11}$ cm$^{-2}$/eV. These values are comparable with lowest values of $D_{it}$ reported in the prior art for p-type SiC MOS capacitors.

One reason for the low oxide and interface trap densities is that nitrogen from the plasma generated in the atmosphere containing N₂O and He passivates dangling Si bonds at the SiC surface without forming a poor-quality thin oxide layer. We confirmed the absence of a thin oxide layer by ellipsometery and Fourier transform infrared (FTIR) spectroscopy measurements on pretreated substrates.

Though we have described specific method steps and structures for which our experiments were performed, the invention is not limited to such process steps or to such structures. In particular, though we described the use of JVD for deposition of the oxide layer, other deposition methods can be used including, for example, remote plasma enhanced chemical vapor deposition (RPECVD) and other chemical vapor deposition (CVD) techniques. Furthermore, the deposited dielectric layer need not be SiO₂, but can, for example, also be silicon nitride, silicon oxynitride, or oxide/nitride stacks. Also, other gases, such as Ar or N₂, can be used in place of He in our experiments, which was used as a carrier gas and was also in the atmosphere when plasmas were generated. We also used p-type 6H-SiC, but other types of SiC substrates can be used. Also, aluminum was used to form electrodes in the description above, but polysilicon can also be used and is more common in the semiconductor industry. Finally, the method can be applied to any device that incorporates a dielectric layer formed on a SiC substrate, for example, SiC-based MOSFET, JFET, CMOS, IGBT, or MCT devices can benefit from pretreating the SiC substrate with the N₂O plasma.

What is claimed is:

1. A method of fabricating a semiconductor structure, said method comprising:

providing a SiC substrate;

pretreating the SiC substrate with a plasma generated in an atmosphere containing N₂O; and forming a dielectric layer on the surface of the pretreated SiC substrate, wherein the pretreating step is performed under plasma processing conditions which result in an interface between said dielectric layer and said substrate that exhibits (1) a dielectric charge density of less than about $3 \times 10^{11}$ cm$^{-2}$, (2) an interface trap density of less than about $2 \times 10^{11}$ cm$^{-2}$, and (3) a measurable flat-band voltage.

2. The method of claim 1 wherein the SiC substrate is p-type.

3. The method of claim 1 wherein the dielectric layer is SiO₂.

4. The method of claim 3 wherein the step of forming the dielectric layer comprises reacting species derived from N₂O and SiH₄.

5. The method of claim 3 wherein the step of forming the dielectric layer comprises using a plasma to form reactive species of N₂O and SiH₄.

6. The method of claim 1 wherein the step of forming the dielectric layer comprises producing a second plasma.

7. The method of claim 1 wherein the SiC substrate in the step of treating the SiC substrate with the plasma is not heated.

8. The method of claim 1 wherein treating the SiC substrate with the plasma comprises carrying the plasma to the substrate in a jet of a carrier gas.

9. The method of claim 1 wherein the step of forming the dielectric layer comprises using jet vapor deposition.

10. The method of claim 1 wherein the step of forming the dielectric layer comprises using chemical vapor deposition.

11. The method of claim 1 further comprising the steps:

annealing the dielectric layer formed on the SiC substrate; and forming a gate electrode on the annealed dielectric layer.

12. The method of claim 1 wherein the plasma is generated in an atmosphere of N₂O and He and wherein the N₂O and He in said atmosphere represent the primary gas components of that atmosphere.

13. The method of claim 1 wherein the plasma is generated in an atmosphere of N₂O and He and further comprising delivering the N₂O at a first flow rate and delivering the He at a second flow rate to produce said atmosphere, wherein said second flow rate is greater than said first flow rate.

14. The method of claim 1 wherein the plasma is generated in an atmosphere of N₂O and He and further comprising delivering the N₂O at a first flow rate and delivering the He at a second flow rate to produce said atmosphere, wherein said second flow rate is substantially greater than said first flow rate.

15. The method of claim 1 wherein the plasma is generated in an atmosphere of N₂O and He and further comprising delivering only N₂O and He to produce said atmosphere.

* * * * *